US012658934B2

(12) United States Patent
Hwang et al.

(10) Patent No.: US 12,658,934 B2
(45) Date of Patent: Jun. 16, 2026

(54) ANALOG-TO-DIGITAL CONVERTER AND SEMICONDUCTOR DEVICE HAVING THE SAME

(71) Applicant: LX SEMICON CO., LTD., Daejeon (KR)

(72) Inventors: Won Joon Hwang, Daejeon (KR); Byung Jun Seo, Daejeon (KR); Ju Hyun Lee, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 223 days.

(21) Appl. No.: 18/537,037

(22) Filed: Dec. 12, 2023

(65) Prior Publication Data
US 2024/0195429 A1     Jun. 13, 2024

(30) Foreign Application Priority Data

Dec. 13, 2022     (KR) ........................ 10-2022-0173353
Sep. 7, 2023     (KR) ........................ 10-2023-0118714

(51) Int. Cl.
*H03M 1/46*          (2006.01)

(52) U.S. Cl.
CPC ........... *H03M 1/466* (2013.01); *H03M 1/462* (2013.01); *H03M 1/468* (2013.01)

(58) Field of Classification Search
CPC ....... H03M 1/466; H03M 1/468; H03M 1/462
(Continued)

(56) References Cited

U.S. PATENT DOCUMENTS 6,864,821 B2 *   3/2005   Yang ..................... H03M 1/682
                                                          341/155
8,242,945 B2 *   8/2012   Sawai ................. H03M 1/1071
                                                          341/155
(Continued)

FOREIGN PATENT DOCUMENTS

CN          102324934 A      1/2012
CN          109379082 A      2/2019
(Continued)

OTHER PUBLICATIONS

Shan et al., "A 12-bit 1MS/s Non-calibrating SAR A/D Converter Based on 90nm CMOS Process," 2010 International Conference on Machine Vision and Human-Machine Interface (MVHI), IEEE, Piscataway, NJ, US, Apr. 24, 2010, pp. 784-787, XP 031720496.
(Continued)

*Primary Examiner* — Khai M Nguyen
(74) *Attorney, Agent, or Firm* — ROTHWELL, FIGG, ERNST & MANBECK, P.C.

(57)          ABSTRACT

The present disclosure relates to an analog-to-digital converter that reduces power consumption by reducing an operating current and a semiconductor device having the same. The analog-to-digital converter includes a capacitor-resistor (C-R) hybrid digital-to-analog converter (DAC) circuit including a capacitor digital-to-analog converter (CDAC) circuit including a capacitor array, and a resistor digital-to-analog converter (RDAC) circuit including a resistor string, a comparator that compares an output voltage of the C-R hybrid DAC circuit with a common mode voltage and outputs a comparison result, and a control logic circuit that controls a switch operation of the C-R hybrid DAC circuit and the comparison operation of the comparator using a driving clock with a duty cycle greater than a duty cycle of the first clock based on a system clock, and
(Continued)

determines each bit of digital data by receiving the comparison result of the comparator.

20 Claims, 9 Drawing Sheets

(58) Field of Classification Search
USPC .................................. 341/155, 161, 163, 172
See application file for complete search history.

(56) References Cited

U.S. PATENT DOCUMENTS

| | | | |
|---|---|---|---|
| 8,344,925 B1 | 1/2013 | Evans | |
| 8,659,460 B2 * | 2/2014 | Nani ........................ | H03M 1/08 341/172 |

FOREIGN PATENT DOCUMENTS

| | | |
|---|---|---|
| CN | 114531153 A | 5/2022 |
| EP | 1583244 A1 | 10/2005 |

OTHER PUBLICATIONS

Yang et al. "An Area-efficient Coarse-Fine Resistor-String D/A Converter," 2010 First IEEE Latin American Symposium on Circuits and Systems (LASCAS), IEEE, Feb. 24, 2010, pp. 29-32, XP 032867830.

Extended European Search Report dated May 7, 2024, issued for the corresponding European patent application No. 23216239.6, 14 pages.

Office Action dated Apr. 1, 2026, issued for the corresponding European patent application No. EP 23216239.6, 17 pages.

* cited by examiner

ANALOG-TO-DIGITAL CONVERTER AND SEMICONDUCTOR DEVICE HAVING THE SAME

This application claims the priority benefit of Korean Patent Application Nos. 10-2022-0173353 filed on Dec. 13, 2022 and 10-2023-0118714 filed on Sep. 7, 2023, all of which are hereby incorporated by reference in their entirety as if fully set forth herein.

BACKGROUND

Field

The present disclosure relates to an analog-to-digital converter that may reduce power consumption by reducing operating current and a semiconductor device having the same.

Discussion of the Related Art

An electronic device includes an analog-to-digital converter (ADC) that converts an analog signal into digital data, as a basic component.

For example, the ADC may be built into a micro controller unit (MCU) and convert the analog signal into the digital data. The ADC may convert the analog signal sensed via a sensor into the digital data for digital signal processing.

Among analog-to-digital conversion schemes, a successive approximation register (SAR) ADC that quantizes a voltage of the analog signal using a binary search scheme is mainly used.

As a resolution increases, the SAR ADC may have a capacitor-resistor (C-R)-type hybrid digital-to-analog converter (DAC) structure that includes a capacitor array and a resistor string.

The SAR ADC including the C-R hybrid DAC structure requires a method to reduce operating current to reduce power consumption.

In one example, in addition to the successive approximation register (SAR) described above, types of ADC include a pipelined ADC, an algorithmic ADC, and the like.

The SAR is mainly described herein, but the technical ideas of the present disclosure are applicable to various ADC technologies.

SUMMARY

The present disclosure provides an analog-to-digital converter that may reduce power consumption by reducing operating current and a semiconductor device having the same.

An analog-to-digital converter according to one embodiment of the present disclosure includes a capacitor-resistor (hereinafter, C-R) hybrid digital-to-analog converter (hereinafter, DAC) circuit including a capacitor digital-to-analog converter (CDAC) circuit including a capacitor array, and a resistor digital-to-analog converter (RDAC) circuit including a resistor string, a comparator that compares an output voltage of the C-R hybrid DAC circuit with a common mode voltage and outputs a comparison result, and a control logic circuit that controls a switch operation of the C-R hybrid DAC circuit and the comparison operation of the comparator using a driving clock with a duty cycle greater than a duty cycle of the first clock based on a system clock, and determines each bit of digital data by receiving the comparison result of the comparator.

An analog-to-digital converter according to one embodiment of the present disclosure includes a capacitor-resistor (hereinafter, C-R) hybrid digital-to-analog converter (hereinafter, DAC) circuit including a capacitor digital-to-analog converter (CDAC) circuit including a capacitor array, and a resistor digital-to-analog converter (RDAC) circuit including a resistor string, a comparator that compares an output voltage of the C-R hybrid DAC circuit with a common mode voltage and outputs a comparison result, and a successive approximation register (hereinafter, SAR) control logic circuit that controls a switch operation of the C-R hybrid DAC circuit and the comparison operation of the comparator using a driving clock, and determines each bit of digital data by receiving the comparison result of the comparator, and a voltage settling period after changing a switch of the C-R hybrid DAC circuit is secured to be longer than a comparison operation period of the comparator and a bit determining period of the control logic circuit in each period of the driving clock.

A semiconductor device according to one embodiment of the present disclosure includes the analog-to-digital converter.

The SAR ADC according to one embodiment of the present disclosure may secure the voltage settling period after the switch change of the C-R hybrid DAC circuit in each period of the driving clock using the driving clock with the duty cycle greater than that of the first clock in the converting phase, thereby reducing the power consumption by suppressing the increase in the current of the RDAC circuit.

The SAR ADC according to one embodiment of the present disclosure may secure the voltage settling period after the switch change of the C-R hybrid DAC circuit much longer than the comparison operation period of the comparator and the bit determining period of the SAR control logic circuit in each period of the driving clock during the converting phase, thereby reducing the power consumption by suppressing the increase in the current of the RDAC circuit for the voltage settling.

Therefore, the semiconductor device using the SAR ADC according to one embodiment of the present disclosure may reduce the power consumption.

DESCRIPTION OF SPECIFIC EMBODIMENTS

Figure 1:
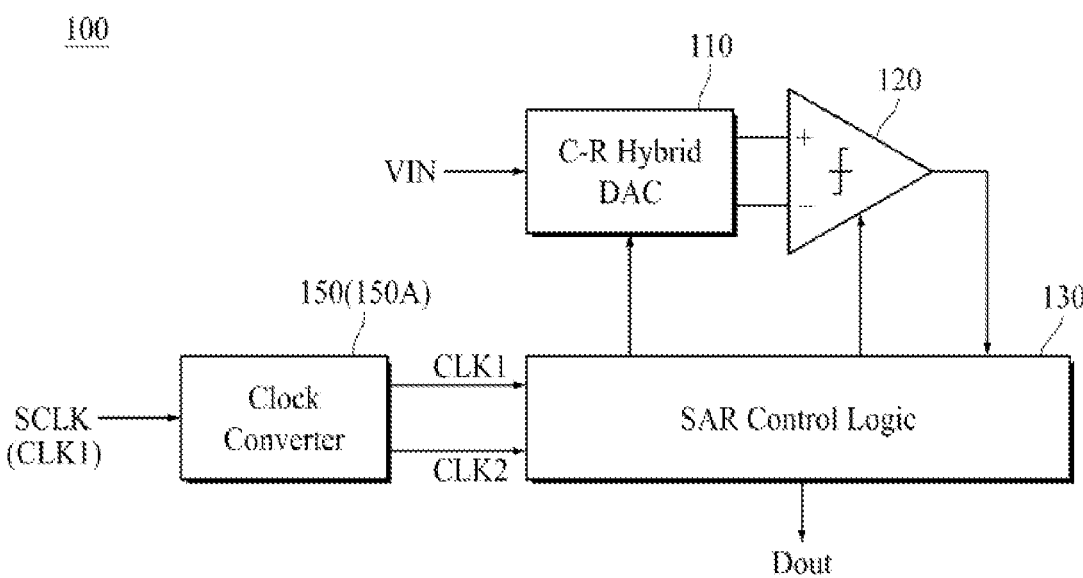
FIG. 1 is a block diagram schematically showing a SAR ADC according to an embodiment of the present disclosure.

Like reference numerals refer to substantially the same components throughout the present document. In a following description, when it is not related to the core composition of the present disclosure, detailed descriptions of the composition and functions known in the technical field of the present disclosure may be omitted. The meaning of terms described herein should be understood as follows.

The advantages and features of the present disclosure, and methods for achieving them, will become clear with reference to the embodiments described in detail below along with the accompanying drawings. However, the present disclosure will not be limited to the embodiments disclosed below and will be implemented in various different forms. The present embodiments only ensure that the disclosure of the present disclosure is complete, and are provided to fully inform those skilled in the art of the present disclosure of the scope of the present disclosure. The present disclosure is only defined by the scope of the claims.

Like reference numerals refer to like components throughout the present document. Additionally, when describing the present disclosure, when it is judged that a detailed description of the related known technology may unnecessarily obscure the gist of the present disclosure, the detailed description will be omitted.

When the terms 'include', 'have', 'composed of', and the like mentioned herein are used, other components may be added unless the term 'only' is used. When a component is expressed in the singular, the plural case is included unless specifically stated otherwise.

In descriptions of temporal relationships, for example, temporal precedent relationships between two events such as "after", "subsequent to", "before", etc., another event may occur therebetween unless "immediately" or "directly" is indicated.

Although first, second, and the like are used to describe various components, such components are not limited by these terms. These terms are merely used to distinguish one component from another. Accordingly, the first component mentioned below may be the second component within the technical idea of the present disclosure.

The term "at least one" should be understood to include all possible combinations presented from one or more related items. For example, "at least one of first, second, and third items" may mean combinations of all items that may be presented from two or more of the first, second, and third items as well as each of the first, second, or third items.

Respective features of the various embodiments of the present disclosure may be coupled or combined with each other, partially or entirely, and various technological interconnections and operations are possible. The embodiments may be implemented independently of each other or together in a related relationship.

Hereinafter, preferred embodiments of the present disclosure will be described with reference to the attached drawings.

FIG. 1 is a block diagram schematically showing a SAR ADC according to an embodiment of the present disclosure.

Referring to FIG. 1, a SAR ADC 100 according to one embodiment may include a capacitor-resistor (hereinafter, C-R) hybrid digital-to-analog converter (hereinafter, DAC) circuit 110, a comparator 120, a successive approximation register (SAR) control logic circuit 130, and a clock converter 150 or 150A. The SAR ADC 100 may receive an input voltage VIN, convert the input voltage VIN into digital data Dout, and output the digital data Dout.

The C-R hybrid DAC circuit 110 may include a capacitor DAC (hereinafter, referred to as CDAC) circuit including a capacitor array and a switch array, and a resistor DAC (hereinafter, referred to as RDAC) circuit including a resistor string and a switch array. In the C-R hybrid DAC circuit 110, the CDAC circuit may be used to determine upper bits and the RDAC circuit may be used to determine lower bits together with a unit capacitor 1C of the CDAC circuit.

The C-R hybrid DAC circuit 110 may charge the capacitor array with charges based on the input voltage VIN, then discharge the charges charged in the capacitor array in response to switch control based on binary search of the SAR control logic circuit 130 to generate an output voltage, and then output the output voltage to the comparator 120.

The comparator 120 may compare the output voltage of the C-R hybrid DAC circuit 110 supplied to a first input (+) terminal with a common mode voltage supplied to a second input (−) terminal, and output an output bit COMPout based on the comparison results to the SAR control logic circuit 130.

The SAR control logic circuit 130 may control a switch operation of the C-R hybrid DAC circuit 110 using the binary search method. The SAR control logic circuit 130 may receive the output bit COMPout from the comparator 120, sequentially determine the most significant bit (MSB) to the least significant bit (LSB), and output the digital data Dout.

The SAR ADC 100 according to one embodiment may operate in a sampling phase and a converting phase to convert the input voltage VIN into the digital data Dout. The converting phase may be expressed as a comparison phase.

The SAR control logic circuit 130 may control the C-R hybrid DAC circuit 110 and the comparator 120 to operate in the sampling phase and the converting phase.

In the sampling phase, the C-R hybrid DAC circuit 110 may sample the input voltage VIN and store the sampled input voltage VIN in the capacitor array.

In the converting phase, the SAR control logic circuit 130 may determine the MSB to the LSB sequentially in bit units using the comparison results (COMPout) of the comparator 120, which compares the output voltage that varies in response to the switch operation of the C-R hybrid DAC circuit 110 with the common mode voltage.

The SAR control logic circuit 130 according to one embodiment may receive a first clock CLK1 and a second clock CLK2 of different phases from the clock converter 150 or 150A and generate a driving clock that controls an operation of the ADC. The SAR control logic circuit 130 may use the first and second clocks CLK1 and CLK2 to generate the driving clock with a duty cycle greater than that of the first clock CLK1. A pulse width of a high logic period of the driving clock may be greater than that of a low logic period.

The SAR control logic circuit 130 may change a switch of the C-R hybrid DAC circuit 110 at a rising time of the driving clock, and may control the comparator 120 to start a comparison operation at a falling time of the driving clock. In particular, because the pulse width of the high logic period is greater than that of the low logic period of the driving clock, a voltage settling period may be secured after changing the switch of the C-R hybrid DAC circuit 110. Accordingly, the SAR ADC 100 may suppress an increase in current of the C-R hybrid DAC circuit 110 to secure the voltage settling period after switching, thereby reducing power consumption.

The SAR control logic circuit 130 according to one embodiment may use driving clocks with different duty cycles in the sampling phase and the converting phase. For example, the SAR control logic circuit 130 may use the first clock CLK1 as the driving clock in the sampling phase, and may use the driving clock with the duty cycle greater than that of the first clock in the converting phase.

The SAR control logic circuit 130 according to one embodiment may use a driving clock with the same duty cycle in the sampling phase and the converting phase, that is, the driving clock with the duty cycle greater than that of the first clock CLK1.

The clock converter 150 or 150A according to one embodiment may receive a system clock SCLK or the first clock CLK1 and output the first clock CLK1 and the second clock CLK2 to the SAR control logic circuit 130. The clock converter 150 or 150A may be built into the SAR control logic circuit 130.

When receiving the system clock SCLK with a higher frequency than the driving clock, the clock converter 150 according to one embodiment may generate the first clock CLK1 by dividing the system clock SCLK, and phase-shift the first clock CLK1 to output the second clock CLK2.

When receiving the system clock SCLK with the same frequency as the driving clock, the clock converter 150A according to one embodiment may output the system clock SCLK as the first clock CLK1 and phase-shift the first clock CLK1 to output the second clock CLK2.

Figure 2:
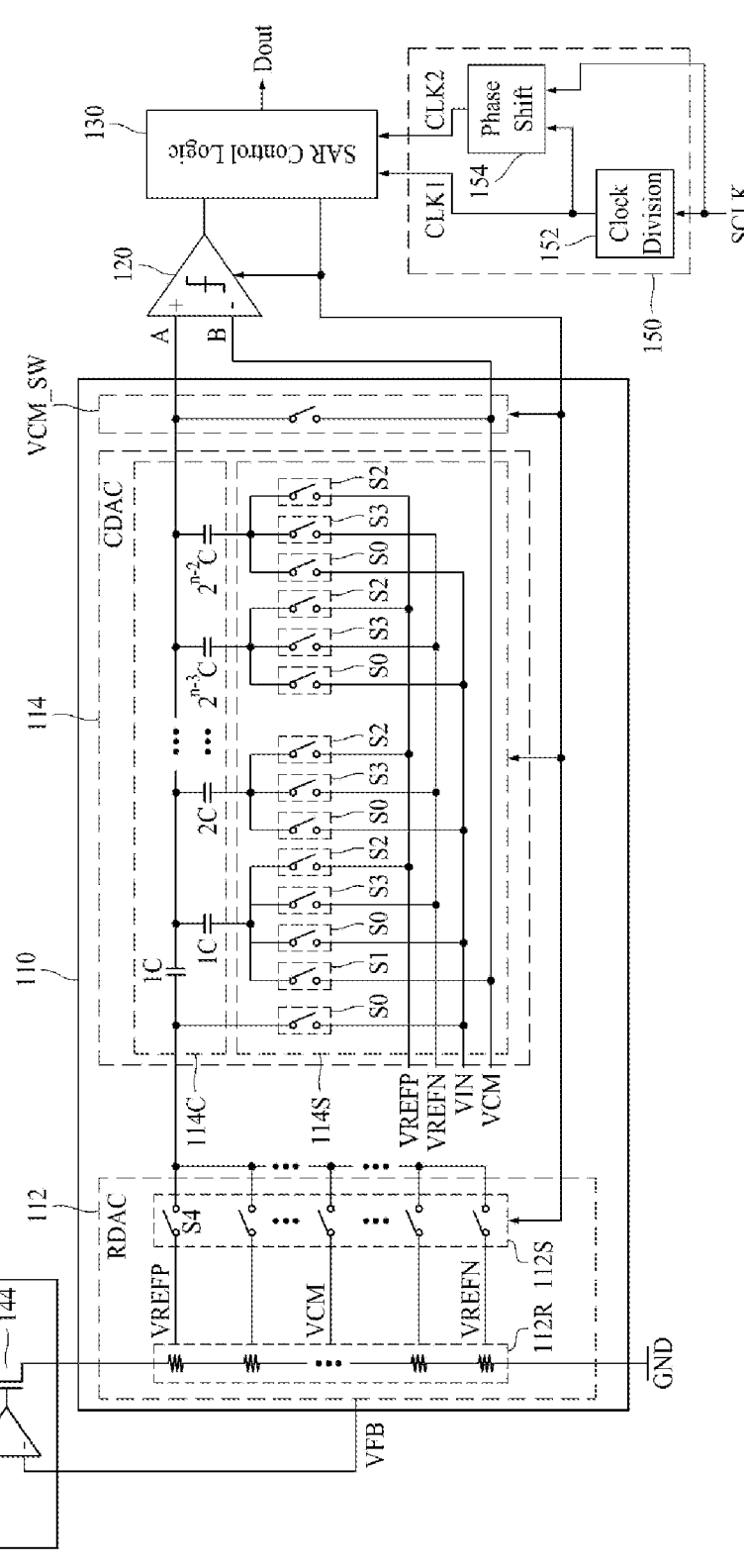
FIG. 2 is a circuit diagram specifically showing a SAR ADC according to an embodiment of the present disclosure.
Figure 3:
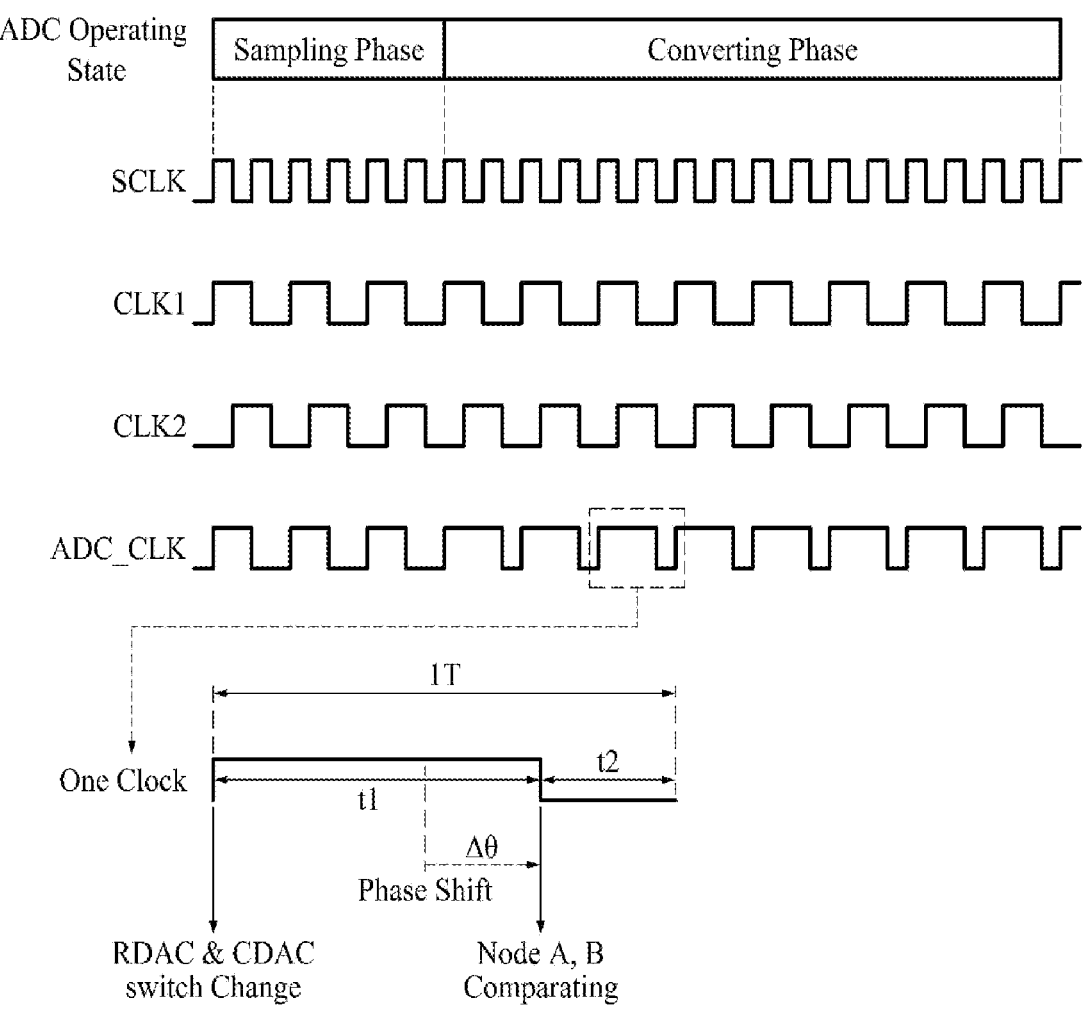
FIG. 3 is an operation timing diagram of a SAR ADC according to an embodiment of the present disclosure.
Figure 4:
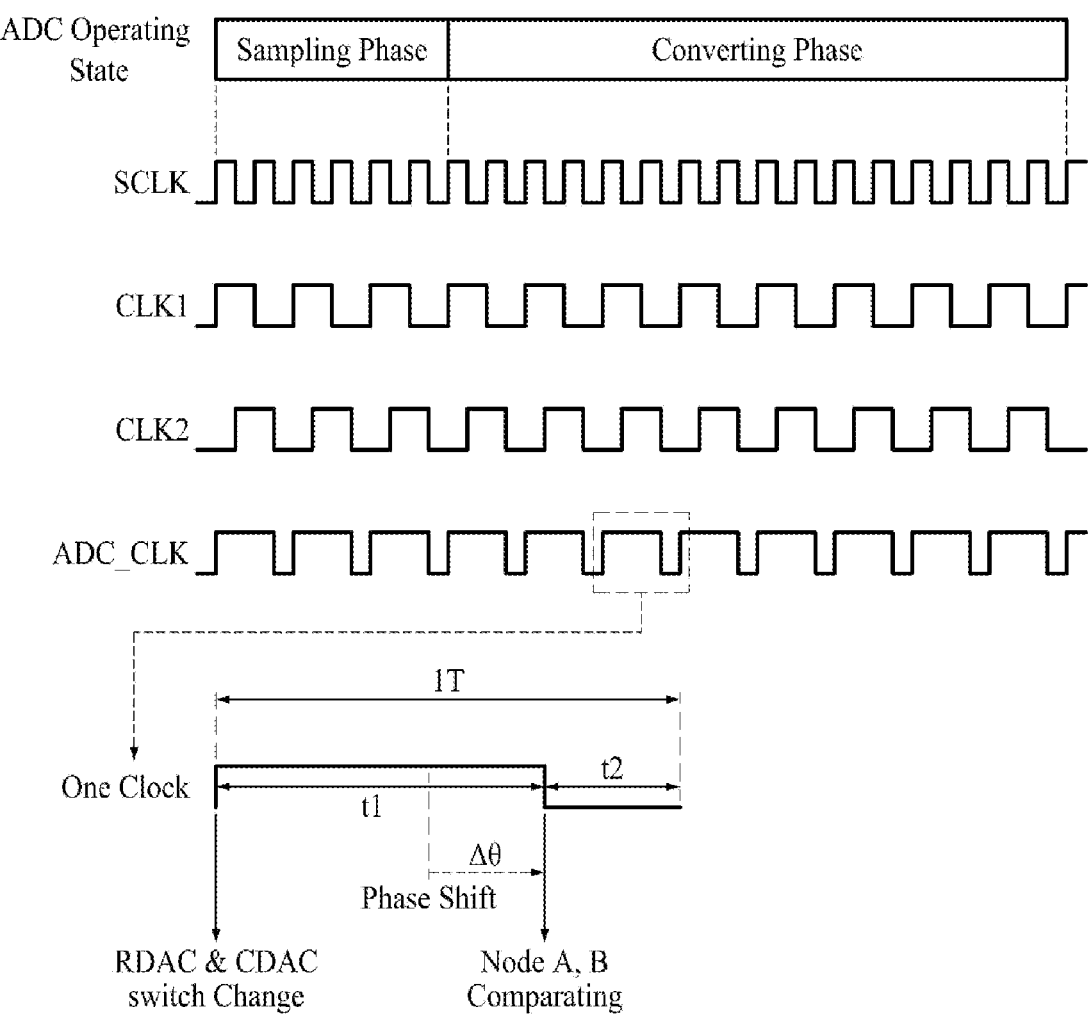
FIG. 4 is an operation timing diagram of a SAR ADC according to an embodiment of the present disclosure.

FIG. 2 is a circuit diagram specifically showing a SAR ADC according to an embodiment of the present disclosure, and each of FIGS. 3 and 4 is an operation timing diagram of a SAR ADC according to an embodiment of the present disclosure shown in FIG. 2.

Referring to FIG. 2, the SAR ADC 100 according to one embodiment may include the C-R hybrid DAC circuit 110, the comparator 120, the SAR control logic circuit 130, and the clock converter 150.

The C-R hybrid DAC circuit 110 according to one embodiment may include a CDAC circuit 114 including the capacitor array used to determine the upper bits, and an RDAC circuit 112 including the resistor string used to determine the lower bits. The CDAC circuit 114 may be used to determine upper n bits (n is an integer equal to or greater than 2), and the RDAC circuit 112 may be used to determine lower m bits (m is an integer equal to or greater than 2).

The RDAC circuit 112 may receive a bias current from a current generator 200 and generate a plurality of reference voltages VREFP to VREFN and a common mode voltage VCM having different voltage levels.

The current generator 200 may include an operational amplifier 142 and an output transistor 144, and may generate the bias current proportional to an input reference voltage VREF and output the bias current to the RDAC circuit 112.

The operational amplifier 142 may receive the input reference voltage VREF from a reference voltage generator at a first input (+) terminal, and receive a feedback voltage VFB supplied from the RDAC circuit 112 at a second input (−) terminal. The operational amplifier 142 may generate a control voltage such that the feedback voltage VFB fed back from the RDAC circuit 112 is maintained equal to the reference voltage VREF.

The output transistor 144 may generate the bias current, which is a constant current, in response to the control voltage output from the operational amplifier 142 and output the bias current to the RDAC circuit 112.

The RDAC circuit 112 may include a resistor string 112R and a switch array 112S, and the switch array 112S may include a plurality of switches S4 respectively connected to a plurality of voltage divider nodes of the resistor string 112R.

The resistor string 112R may be composed of a plurality of resistors connected in series with each other between an output line of the current generator 200 and a ground GND. The resistor string 112R may generate the positive reference voltage VREFP, a negative reference voltage VERFN, the common mode voltage VCM, and a plurality of variable reference voltages using the bias current supplied from the current generator 200.

For example, the plurality of variable reference voltages generated in the resistor string 112R may include voltages $VREFP/2^n$ and $VREFN/2^n$ obtained by dividing the positive reference voltage VREFP and the negative reference voltage VREFN by a ratio of the power of 2 ($2^n$), respectively, in a range between the positive reference voltage VREFP and the negative reference voltage VERFN.

The switch array 112S may apply the positive reference voltage VREFP, the negative reference voltage VERFN, and the common mode voltage VCM generated by the resistor string 112R to the CDAC circuit 114 in response to the control of the SAR control logic circuit 130.

The switch array 112S may sequentially output the variable reference voltages in response to the control of the SAR control logic circuit 130 and apply the variable reference voltages to the unit capacitor 1C of the CDAC circuit 114. The plurality of variable reference voltages sequentially output from the RDAC circuit 112 may be applied to the unit capacitor 1C of the CDAC circuit 114 and used to sequentially determine the lower bits.

The CDAC circuit 114 may include a capacitor array 114C in which capacitors 1C, 2C, . . . , $2^{n-3}$C, and $2^{n-2}$C whose capacitances have the ratio of the power of 2 are connected in parallel with each other, and a switch array 114S composed of switches S0, S1, S2, and S3 connected to a bottom plate of the capacitor array 114C. A top plate of the capacitor array 114C may be connected to the first input (+) terminal of the comparator 120 via a first node A, and may be connected to a common switch VCM_SW that applies the common mode voltage VCM.

Each of the capacitors 1C, 2C, . . . , $2^{n-3}$C, and $2^{n-2}$C may receive the input voltage VIN via the sampling switch S0, and may receive the positive reference voltage VREFP via the switch S2, or may receive the negative reference voltage VREFN via the switch S3. One of the two unit capacitors 1C and 1C may receive the common mode voltage VCM via the switch S1.

The capacitors 2C, . . . , $2^{n-3}$C, and $2^{n-2}$C may have an equally dividing capacitor (EDC) structure.

For example, a 16C ($=2^4$C) capacitor may contain a pair of 8C ($=2^3$C) equally dividing capacitors. When the positive reference voltage VREFP and the negative reference voltage VREFN are respectively applied to the pair of 8C equally dividing capacitors, the 16C capacitor to which the common mode voltage VCM is applied may be implemented. Depending on a comparison result (COMPout=1 or 0) of the comparator 120, the 8C equally dividing capacitor pair may implement the 16C capacitor to which the positive reference voltage VREFP or the negative reference voltage VREFN is applied. Each of the 8C equally dividing capacitors may receive the input voltage VIN via the sampling switch S0, and may selectively receive the positive reference voltage VREFP and the negative reference voltage VREFN via the switches S2 and S3.

The C-R hybrid DAC circuit 110 may allow the switch arrays 112S and 114S to perform the switch operation under the control of the SAR control logic circuit 130 and generate an output voltage VDAC-VIN at the first node A.

The comparator 120 may repeat an operation of comparing the output voltage VDAC-VIN of the C-R hybrid DAC circuit 110 generated at the first node A with the common mode voltage VCM applied to a second node B and output the output bit (COMPout=0, 1) to the SAR control logic circuit 130.

The SAR control logic circuit 130 may control the operations of the C-R hybrid DAC circuit 110 and the comparator 120 in the sampling phase and the converting phase based on a driving clock ADC_CLK shown in FIG. 3. In the converting phase, the SAR control logic circuit 130 may receive the output bit COMPout from the comparator 120, then determine a code in units of bits, and then output the digital data Dout.

The SAR control logic circuit 130 may receive the first clock CLK1 and the second clock CLK2 of the different phases from the clock converter 150, and generate the driving clock ADC_CLK with the duty cycle greater than the first clock CLK1 and use the driving clock ADC_CLK to control the ADC operation. The driving clock ADC_CLK may have the same frequency as the first clock CLK1 and synchronized with the first clock CLK1 in the rising time.

The clock converter 150 may receive the system clock SCLK and output the first clock CLK1 and the second clock CLK2 to the SAR control logic circuit 130, or may be built into the SAR control logic circuit 130. The clock converter 150 may include a clock dividing circuit 152 and a phase shift circuit 154.

The clock converter 150 may receive the system clock SCLK, which has the higher frequency than the first clock CLK1, may generate first clock CLK1 by dividing the system clock SCLK in the clock division circuit 152, and phase-shift the first clock CLK1 in the phase shift circuit 154 to output the second clock CLK2.

For example, as shown in FIG. 3, the clock converter 150 may generate the first clock CLK1 by receiving the system clock SCLK, which has a frequency twice higher than the first clock CLK1, and dividing the system clock by 2, and may generate the second clock CLK2 by phase-shifting the first clock CLK1 by 90 degrees. The first and second clocks CLK1 and CLK2 may have a 90 degree phase difference.

In contrast, the clock converter 150 may generate the first clock CLK1 by receiving the system clock SCLK, which has a frequency 4 times higher than the first clock CLK1, and dividing the system clock by 4, and may generate the second clock CLK2 by phase-shifting the first clock CLK1 by 45 degrees. The first and second clocks CLK1 and CLK2 may have a phase difference of 45 degrees.

The SAR control logic circuit 130 may generate the driving clock ADC_CLK with the duty cycle greater than that of the first clock CLK1 by logically combining the first and second clocks CLK1 and CLK2 with each other. The driving clock ADC_CLK may have the duty cycle greater than a 50% duty cycle and smaller than a 100% duty cycle. For example, the first clock CLK1 may have the 50% duty cycle, and the driving clock ADC_CLK may have a 75% duty cycle.

A high logic period t1 of the driving clock ADC_CLK may be greater than a low logic period t2. The high logic period t1 of the driving clock ADC_CLK may have a period greater than the high logic period of the first clock CLK1 by the phase difference $\Delta\theta$ between the first and second clocks CLK1 and CLK2.

Referring to FIG. 3, in the sampling phase, the SAR control logic circuit 130 may control the C-R hybrid DAC circuit 110 to sample the input voltage VIN and charge the capacitor array with the input voltage during a plurality of periods of the driving clock ADC_CLK.

In the converting phase, the SAR control logic circuit 130 may control the switch operation of the C-R hybrid DAC circuit 110 and the comparison operation of the comparator 120 for each period 1T of the driving clock ADC_CLK.

In the converting phase, the SAR control logic circuit 130 may change the switch of the C-R hybrid DAC circuit 110 at the rising time of the driving clock ADC_CLK, and the comparator 120 may be controlled to start a comparison operation of the first and second nodes A and B at the falling time of the driving clock ADC_CLK.

In particular, in the converting phase, because the high logic period t1 is greater than the low logic period t2, the driving clock ADC_CLK may secure the voltage settling period after changing the switch of the C-R hybrid DAC circuit 110. In other words, after changing the switch of the C-R hybrid DAC circuit 110 in each period of the driving clock ADC_CLK by the driving clock ADC_CLK, the voltage settling period t1 may be secured much longer than a comparison operation period of the comparator 120 and the bit determining period t2 of the SAR control logic circuit 130.

Accordingly, the SAR ADC according to one embodiment may suppress the increase in the current of the RDAC 112 compared to a case in which the current of the RDAC 112 is increased for voltage settling in the C-R hybrid DAC circuit 110, thereby reducing the power consumption.

The SAR control logic circuit 130 may use the driving clock ADC_CLK with the different duty cycles or the same duty cycle in the sampling phase and the converting phase.

Referring to FIG. 3, the SAR control logic circuit 130 according to one embodiment may use the first clock CLK1 as the driving clock ADC_CLK in the sampling phase, and may use the driving clock ADC_CLK with the duty cycle greater than that of the first clock CLK1 in the converting phase.

Referring to FIG. 4, the SAR control logic circuit 130 according to one embodiment may use the driving clock ADC_CLK with the same duty cycle in the sampling phase and the converting phase, that is, the driving clock ADC_CLK with the duty cycle greater than that of the first clock CLK1.

Figure 5:
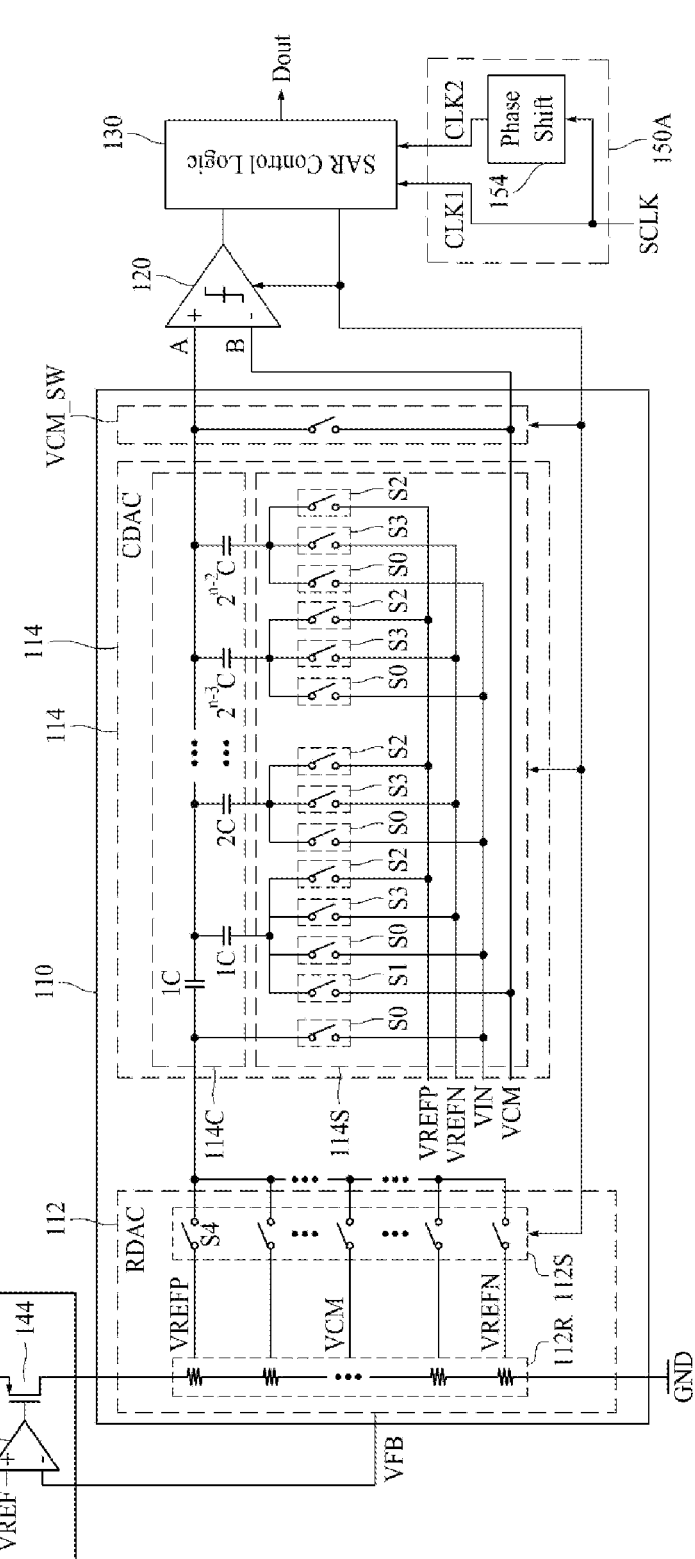
FIG. 5 is a circuit diagram specifically showing a SAR ADC according to an embodiment of the present disclosure.
Figure 6:
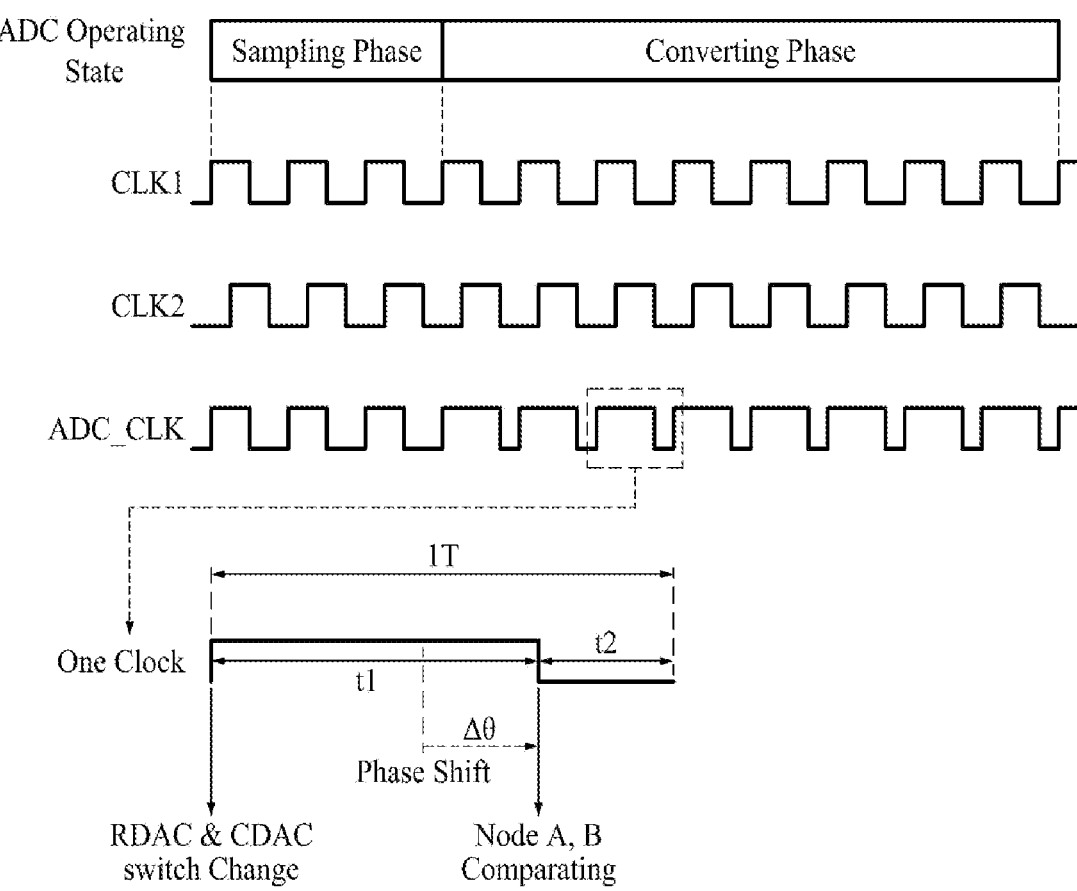
FIG. 6 is an operation timing diagram of a SAR ADC according to an embodiment of the present disclosure.
Figure 7:
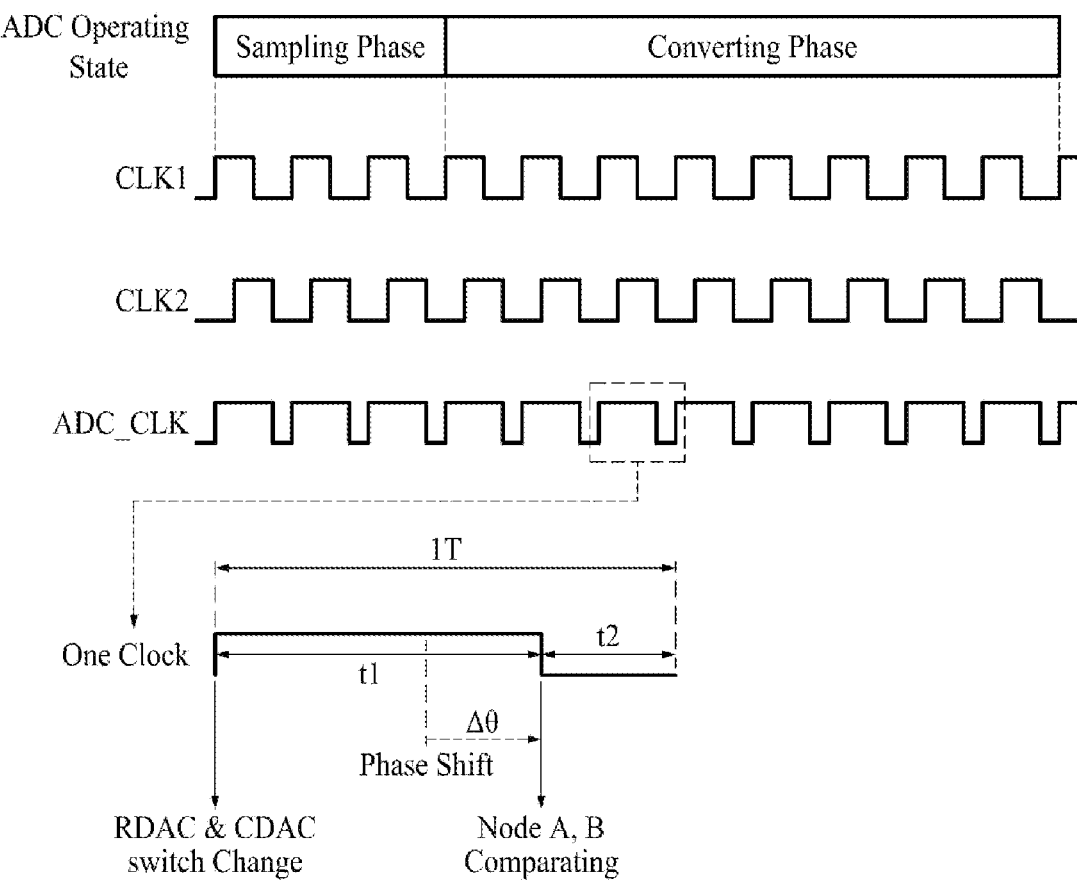
FIG. 7 is an operation timing diagram of a SAR ADC according to an embodiment of the present disclosure.

FIG. 5 is a circuit diagram specifically showing a SAR ADC according to an embodiment of the present disclosure, and each of FIGS. 6 and 7 is an operation timing diagram of a SAR ADC according to an embodiment of the present disclosure shown in FIG. 5.

Because the SAR ADC shown in FIG. 5 has a difference in an internal configuration of the clock converter 150A from the SAR ADC shown in FIG. 2, a description of components duplicated with the components in FIG. 2 will be omitted or brief.

Referring to FIG. 5, the clock converter 150A according to one embodiment may receive the first clock CLK1 as the system clock SCLK and output the same, and phase-shift the first clock CLK1 and output the second clock CLK2. The clock converter 150A may include a phase shift circuit 154. The clock converter 150A may be built into the SAR control logic circuit 130.

When the system clock SCLK has the same frequency as the driving clock ADC_CLK, the clock converter 150A may output the system clock SCLK as the first clock CLK1, and phase-shift the first clock CLK1 and output the second clock CLK2 in the phase shift circuit 154.

The SAR control logic circuit 130 may receive the first clock CLK1 and the second clock CLK2 with the different phases from the clock converter 150A and logically combine the first and second clocks CLK1 and CLK2 with each other to create the driving clock ADC_CLK with the duty cycle greater than that of the first clock CLK1. The high logic period t1 of the driving clock ADC_CLK may be greater than the low logic period t2.

Referring to FIG. 6, in the sampling phase, the SAR control logic circuit 130 may control the C-R hybrid DAC circuit 110 to sample the input voltage VIN and charge the capacitor array with the input voltage during the plurality of periods of the driving clock ADC_CLK.

In the converting phase, the SAR control logic circuit 130 may change the switch of the C-R hybrid DAC circuit 110 at the rising time of the driving clock ADC_CLK for each period 1T of the driving clock ADC_CLK, and may control the comparator 120 to start the comparison operation of the first and second nodes A and B at the falling time of the driving clock ADC_CLK.

In particular, in the converting phase, the high logic period t1 of the driving clock ADC_CLK is greater than the low logic period t2, so that the voltage settling period may be secured after changing the switch of the C-R hybrid DAC circuit 110 for each period of the driving clock ADC_CLK. In other words, in each period of the driving clock ADC_CLK, the voltage settling period t1 after the switch change of the C-R hybrid DAC circuit 110 may be secured longer than the comparison operation period of the comparator 120 and the bit determining period t2 of the SAR control logic circuit 130.

Accordingly, the SAR ADC according to one embodiment may suppress the increase in the current of the RDAC 112 compared to the case in which the current of the RDAC 112 is increased for the voltage settling in the C-R hybrid DAC circuit 110, thereby reducing the power consumption.

The SAR control logic circuit 130 may use the driving clock ADC_CLK with the different duty cycles or the same duty cycle in the sampling phase and the converting phase.

Referring to FIG. 6, the SAR control logic circuit 130 according to one embodiment may use the first clock CLK1 as the driving clock ADC_CLK in the sampling phase, and may use the driving clock ADC_CLK with the duty cycle greater than that of the first clock CLK1 in the converting phase.

Referring to FIG. 7, the SAR control logic circuit 130 according to one embodiment may use the driving clock ADC_CLK with the same duty cycle in the sampling phase and the converting phase, that is, the driving clock ADC_CLK with the duty cycle greater than that of the first clock CLK1.

Figure 8:
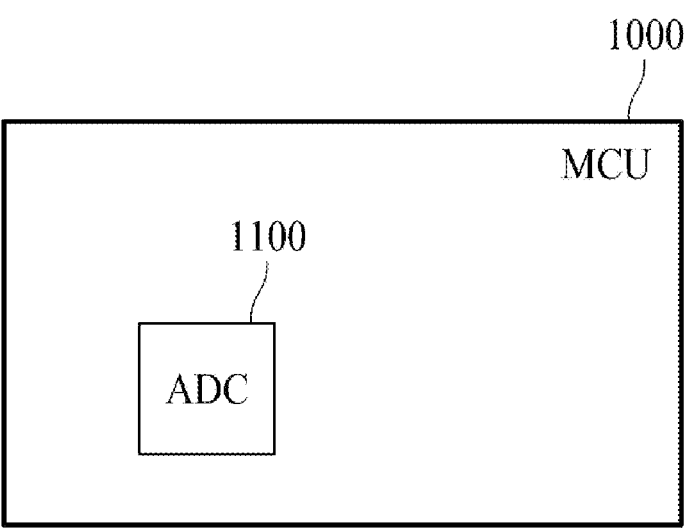
FIG. 8 is a block diagram showing a semiconductor device including an ADC according to an embodiment of the present disclosure.

FIG. 8 is a block diagram showing a semiconductor device including an ADC according to an embodiment of the present disclosure.

Referring to FIG. 8, in one embodiment, a semiconductor device 1000 may include an ADC 1100 according to an embodiment to convert an input analog signal into digital data and use the digital data.

For example, the semiconductor device 1000 may be one of various semiconductor devices such as a micro controller unit (MCU), a processor, a power management integrated circuit (PMIC), a memory, and the like included in a device such as a computer, a smartphone, a tablet, and the like.

One of the SAR ADCs described in FIGS. 1 to 7 may be applied to the ADC 1100 according to one embodiment. Accordingly, the ADC 1100 may suppress the increase in the current for the voltage settling by securing the voltage settling period in each period of the driving clock using the SAR ADC according to one embodiment described above, thereby reducing the power consumption.

Figure 9:
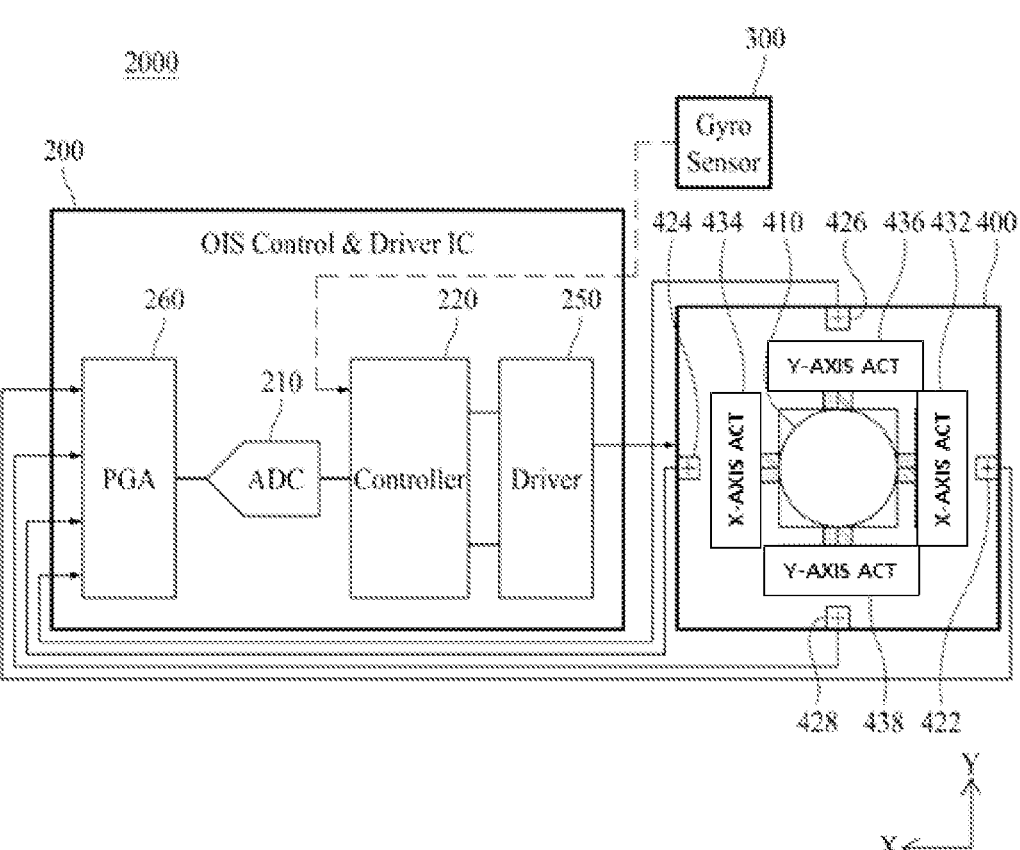
FIG. 9 is a block diagram showing a configuration of a camera module including an ADC according to an embodiment of the present disclosure.

FIG. 9 is a block diagram showing a configuration of a camera module including an ADC according to an embodiment of the present disclosure.

Referring to FIG. 9, a camera module 2000 according to one embodiment includes an actuator module 400, an optical image stabilization (OIS) control driver 200, and a gyro sensor 300.

The camera module further includes a lens module 410 and an image sensor module (not shown). The lens module 410 may be coupled to the actuator module 400 and may be moved by driving of the actuator module 400.

The lens module 410 may include a plurality of lenses and may collect incident light and irradiate the light to a sensor surface of the image sensor. The image sensor module may separate the incident light that is reflected from an object and collected via the lens module into R/G/B (red, green, and blue) colors, and sense an optical signal of each color incident from each pixel and convert the signal into an electrical signal to sense an image.

The actuator module 400 may include a plurality of X-axis and Y-axis actuators ACT 432, 434, 436, and 438 that are driven (moved) in response to an actuator driving signal supplied from the OIS control driver 200 and move the lens module 410 in X-axis and Y-axis directions, respectively. The plurality of actuators 432, 434, 436, and 438 may be driven by individually receiving a plurality of actuator driving signals from the OIS control driver 200. The X-axis direction and the Y-axis direction may be defined as a first direction and a second direction among horizontal directions perpendicular to an optical axis (Z-axis) direction of the lens module 410.

The plurality of actuators 432, 434, 436, and 438 may move the lens module 410 by generating an electromagnetic force between a coil and a magnet. The plurality of actuator driving signals may be current signals applied to coils of the plurality of actuators 432, 434, 436, and 438. The plurality of actuators 432, 434, 436, and 438 may be one of various types of actuators such as a voice coil motor (VCM) type, a shape memory alloy (SMA) type, and a ball type.

The plurality of actuators 432, 434, 436, and 438 may perform an OIS function that cancels an angle change of the camera module caused by hand tremor by moving the lens module 410 under the control of the OIS control driver 200. The OIS function may be expressed as a hand tremor preventing function, an image stabilization function, or a motion compensation function.

The actuator module 400 may include a plurality of Hall sensors 422, 424, 426, and 428 that sense locations of the plurality of actuators 432, 434, 436, and 438, respectively. The plurality of hall sensors 422, 424, 426, and 428 may individually sense the locations of the plurality of actuators 432, 434, 436, and 438 moving in the X-axis and Y-axis directions, respectively, and output a plurality of sensed location signals to the OIS control driver 200. For example, the Hall sensors 422, 424, 426, and 428 may sense a magnetic field strength of the magnet caused by the movement of the actuators 432, 434, 436, and 438 to sense the locations of the actuators 432, 434, 436, and 438. The Hall sensors 422, 424, 426, and 428 may be defined as location sensors.

The gyro sensor 300 may sense the angle change of the camera module caused by the hand tremor, convert the angle change into angular velocity information, and output the angular velocity information to the OIS control driver 200. The gyro sensor 300 may be defined as a motion sensor or an angular velocity sensor.

The OIS control driver 200 may compensate for the hand tremor by cancelling the angle change of the camera module caused by the hand tremor sensed via the gyro sensor 300 by moving the lens module 410 in an opposite direction via driving of the plurality of actuators 432, 434, 436, and 438. The OIS control driver 200 may be implemented as an integrated circuit (IC) by integrating a controller 220 and a driver 250 together. The OIS control driver 200 may be defined as a stabilization controller, an OIS controller, or an OIS driver.

The OIS control driver 200 may include analog front-end (AFE) circuits 260 and 210, the controller 220, and a driver 250.

The analog front-end (AFE) circuits 260 and 210 may amplify fine sensing signals output respectively from the plurality of Hall sensors 422, 424, 426, and 428, and convert the amplified sensing signals into digital sensing data and output the digital sensing data.

The analog front-end circuits 260 and 210 may include the programmable gain amplifier (PGA) 260 and the ADC 210.

The PGA 260 may individually amplify the plurality of sensing signals output from the plurality of Hall sensors 422, 424, 426, and 428. The PGA 260 may sequentially output the plurality of amplified sensing signals to the ADC 210 via a multiplexer (MUX).

The ADC 210 may sequentially convert the sensing signals of the plurality of channels amplified via the PGA 260 into the digital sensing data and output the digital sensing data to the controller 220. The SAR ADC according to one embodiment described in FIGS. 1 to 7 may be applied as the ADC 210 according to one embodiment. Accordingly, the ADC 210 may suppress the increase in the current for the voltage settling by securing the voltage settling period in each period of the driving clock using the SAR ADC according to one embodiment described above, thereby reducing the power consumption.

The controller 220 may calculate a target location value using the angular velocity information supplied from the gyro sensor 300, calculate an error value between the calculated target location value and the sensing data of the plurality of channels supplied from the ADC 210, and generate control signals of the plurality of channels for correcting the calculated error value and output the control signals to the driver 250. The controller 220 may use a signal processor such as a microcontroller unit (MCU), a central processing unit (CPU), or a digital signal processor (DSP).

The driver 250 may individually drive the plurality of actuators 432, 434, 436, and 438 by generating the actuator driving signals of the plurality of channels in response to the control signals of the plurality of channels supplied from the controller 220. The actuator driving signal may be generated in a form of a constant current signal or a pulse width modulation (PWM) signal. The driver 250 may correct the hand tremor by moving the lens module 410 by driving the plurality of actuators 432, 434, 436, and 438 in response to the actuator driving signals of the plurality of channels.

As described above, the SAR ADC according to one embodiment of the present disclosure may secure the voltage settling period after changing the switch of the C-R hybrid DAC circuit in each period of the driving clock using the driving clock with the duty cycle greater than that of the first clock in the converting phase, thereby reducing the power consumption by suppressing the increase in the current of the RDAC circuit.

The SAR ADC according to one embodiment of the present disclosure may secure the voltage settling period after the switch change of the C-R hybrid DAC circuit much longer than the comparison operation period of the comparator and the bit determining period of the SAR control logic circuit in each period of the driving clock during the converting phase, thereby reducing the power consumption by suppressing the increase in the current of the RDAC circuit for the voltage settling.

Therefore, the semiconductor device using the SAR ADC according to one embodiment of the present disclosure may reduce the power consumption.

Those skilled in the art of the technical field to which the present disclosure belongs will understand that the above-described present disclosure may be realized in other specific forms without changing a technical idea or an essential feature thereof.

Therefore, the embodiments described above should be understood in all respects as illustrative and not restrictive. The scope of the present disclosure is indicated by the patent claims to be described later rather than the detailed description above, and the meaning and the scope of the patent claims and all changes or modified forms derived from the equivalent concept thereof must be interpreted to be included in the scope of the present disclosure.

What is claimed is:

1. An analog-to-digital converter comprising:
a capacitor-resistor C-R hybrid digital-to-analog converter DAC circuit including a capacitor digital-to-analog converter CDAC circuit including a capacitor array, and a resistor digital-to-analog converter RDAC circuit including a resistor string;
a comparator configured to compare an output voltage of the C-R hybrid DAC circuit with a common mode voltage and output a comparison result; and
a control logic circuit configured to receive a first clock and a second clock from a clock converter, generate a driving clock based on the first clock, control a switch operation of the C-R hybrid DAC circuit and the comparison operation of the comparator using the driving clock, and determine whether each bit of digital data is an upper bit or a lower bit by receiving the comparison result of the comparator,
wherein the switch operation of the C-R hybrid DAC circuit is changed at a rising time of the driving clock and the comparison operation of the comparator is started at a falling time of the driving clock.

2. The analog-to-digital converter of claim 1, wherein a voltage settling period after changing a switch of the C-R hybrid DAC circuit is secured to be longer than a comparison operation period of the comparator and a bit determining period of the control logic circuit in each period of the driving clock.

3. The analog-to-digital converter of claim 1, wherein in each period of the driving clock, a switch of the C-R hybrid DAC circuit is configured to be changed in synchronization with the rising time of the driving clock, the comparator is configured to perform the comparison operation from the falling time of the driving clock, and the control logic circuit is configured to determine the bit.

4. The analog-to-digital converter of claim 1, wherein a high logic period is longer than a low logic period in the driving clock.

5. The analog-to-digital converter of claim 1, wherein the control logic circuit is configured to:
control the C-R hybrid DAC circuit to sample an input voltage and charge the capacitor array with the input voltage in a sampling phase; and control the switch operation of the C-R hybrid DAC circuit and the comparison operation of the comparator in a converting phase.

6. The analog-to-digital converter of claim 5, wherein the control logic circuit is configured to use the driving clock with the same duty cycle in the sampling phase and the converting phase.

7. The analog-to-digital converter of claim 5, wherein the control logic circuit is configured to use the driving clock with different duty cycles in the sampling phase and the converting phase, and wherein the driving clock has a duty cycle in the converting phase greater than a duty cycle in the sampling phase.

8. The analog-to-digital converter of claim 1, wherein the control logic circuit is configured to:

control the switch operation of the C-R hybrid DAC circuit using the first clock in a sampling phase; and control the switch operation of the C-R hybrid DAC circuit and the comparison operation of the comparator using the driving clock in a converting phase.

9. The analog-to-digital converter of claim 1, further comprising a clock converter configured to receive a system clock to generate the first clock, generate the second clock having a phase difference from the first clock, and output the first clock and the second clock to the control logic circuit.

10. The analog-to-digital converter of claim 9, wherein the clock converter is configured to:

divide the system clock to generate the first clock; and phase-shift the first clock to generate the second clock.

11. The analog-to-digital converter of claim 9, wherein the clock converter is configured to:

output the system clock as the first clock; and phase-shift the first clock to generate the second clock.

12. The analog-to-digital converter of claim 9, wherein the control logic circuit is configured to logically combine the first clock with the second clock to generate the driving clock.

13. The analog-to-digital converter of claim 9, wherein a high logic period of the driving clock has a period where the phase difference between the first clock and the second clock is added to a high logic period of the first clock.

14. The analog-to-digital converter of claim 1, wherein the CDAC circuit includes:

the capacitor array having a plurality of capacitors connected in parallel with each other and a unit capacitor connected to the plurality of capacitors in serial;

a first switch array configured to selectively apply an input voltage, a positive reference voltage, and a negative reference voltage to a bottom plate of the capacitor array and selectively apply the common mode voltage to the unit capacitor in response to the control of the control logic circuit; and a common switch connected to a top plate of the capacitor array configured to generate the output voltage of the C-R hybrid DAC circuit, wherein the common switch is configured to selectively apply the common mode voltage.

15. The analog-to-digital converter of claim 1, wherein the RDAC circuit includes:

the resistor string configured to receive a bias current from a current generator to generate a positive reference voltage, the common mode voltage, and a negative reference voltage and generate a plurality of variable reference voltages within a range between the positive reference voltage and the negative reference voltage; and a second switch array configured to apply the positive reference voltage, the common mode voltage, and the negative reference voltage to a first switch array and apply the plurality of variable reference voltages to a first unit capacitor among a plurality of unit capacitors in response to the control of the control logic circuit.

16. A semiconductor device comprising the analog-to-digital converter of claim 1.

17. An analog-to-digital converter comprising:

a capacitor-resistor C-R hybrid digital-to-analog converter DAC circuit including a capacitor digital-to-analog converter CDAC circuit including a capacitor array, and a resistor digital-to-analog converter RDAC circuit including a resistor string;

a comparator configured to compare an output voltage of the C-R hybrid DAC circuit with a common mode voltage and output a comparison result; and a control logic circuit configured to control a switch operation of the C-R hybrid DAC circuit and the comparison operation of the comparator using a driving clock, and determine whether each bit of digital data is an upper bit or a lower bit by receiving the comparison result of the comparator, wherein a voltage settling period after changing a switch of the C-R hybrid DAC circuit is secured to be longer than a comparison operation period of the comparator and a bit determining period of the control logic circuit in each period of the driving clock, and wherein the switch operation of the C-R hybrid DAC circuit is changed at a rising time of the driving clock and the comparison operation of the comparator is started at a falling time of the driving clock.

18. The analog-to-digital converter of claim 17, wherein the control logic circuit is configured to:

control the C-R hybrid DAC circuit to sample an input voltage and charge the capacitor array with the input voltage in a sampling phase; and control the switch operation of the C-R hybrid DAC circuit and the comparison operation of the comparator in a converting phase.

19. The analog-to-digital converter of claim 18, wherein the control logic circuit is configured to use the driving clock with the same duty cycle in the sampling phase and the converting phase.

20. The analog-to-digital converter of claim 18, wherein the control logic circuit is configured to use the driving clock with different duty cycles in the sampling phase and the converting phase, and wherein the driving clock has a duty cycle in the converting phase greater than a duty cycle in the sampling phase.

* * * * *